United States Patent [19]
Grady, Jr. et al.

[11] Patent Number: 5,384,153
[45] Date of Patent: Jan. 24, 1995

[54] MONITORING ELECTROLESS PLATING BATHS

[75] Inventors: Alfred J. Grady, Jr., Richmond, Va.; Sudarshan Lal, Glen Rock, N.J.; Mary J. Mitchell, Chesterfield, Va.; Yutaka Okinaka, Madison, N.J.; Craig G. Smith, Upper Macungie Township, Lehigh County; Harvey S. Trop, Lower Macungie Township, Lehigh County, both of Pa.; Chwan-Tsann Wang, Richmond, Va.

[73] Assignee: AT&T Corp., Murray Hill, N.J.

[21] Appl. No.: 28,847

[22] Filed: Mar. 10, 1993

[51] Int. Cl.6 .............................................. B05D 1/00
[52] U.S. Cl. ...................................... 427/98; 427/10; 427/96; 427/443.1
[58] Field of Search ................... 427/96, 98, 10, 443.1

[56] References Cited

U.S. PATENT DOCUMENTS

| | | |
|---|---|---|
| 4,469,713 | 9/1984 | Schwiecker ............... 427/10 |
| 4,608,275 | 8/1986 | Kukanskis ............... 427/98 |
| 4,668,532 | 5/1987 | Moisan ............... 427/98 |
| 4,774,101 | 9/1988 | Harris et al. ............... 427/8 |
| 4,931,148 | 6/1990 | Kukanskis ............... 427/98 |
| 4,939,370 | 7/1990 | Meyer ............... 427/10 |

*Primary Examiner*—Shrive Beck
*Assistant Examiner*—Vi Duong Dang
*Attorney, Agent, or Firm*—Lester H. Birnbaum

[57] ABSTRACT

Disclosed is a method of monitoring electroless plating solutions. The solutions are used to plate a light-transmitting medium. Measurements are made to determine the time it takes for light transmission through the medium to be reduced to a certain level. This measurement can be used to determine whether articles will be sufficiently plated by the solutions.

14 Claims, 3 Drawing Sheets

MONITORING ELECTROLESS PLATING BATHS

BACKGROUND OF THE INVENTION

This invention relates to the fabrication of plated articles and, in particular, to a method of monitoring the solutions used to plate such articles.

In the fabrication of printed circuit boards, complete coverage of certain areas by an electroless copper plating operation is an essential step. Unfortunately slight changes in the composition of the solutions required for electroless plating can have a significant effect on the coverage. Consequently, the solutions should be constantly monitored.

Present wet chemical analysis and backlight measurements have generally proven insufficient in either predicting problems or in identifying the cause of problems once they manifest themselves. This has resulted in enormous waste in terms of time and material until the problem is corrected. For example, in a typical printed circuit board fabrication process, it may take several hours for a particular board to traverse the various solutions used for electroless plating. Consequently, the effect of any adjustments in the solutions on the coverage of the board will not show up for a long time.

SUMMARY OF THE INVENTION

In accordance with one aspect, the invention is a method of plating an article by applying thereto a plurality of solutions. The method includes the step monitoring the solutions by applying the solutions to a specimen which permits light to be transmitted therethrough. As the specimen is plated, the level of light transmission therethrough is measured to determine a time in which the level is reduced to a predetermined value.

BRIEF DESCRIPTION OF THE DRAWING

These and other features of the invention are delineated in detail in the following description. In the drawing.

DETAILED DESCRIPTION

The present invention is most advantageous in the fabrication of printed circuit boards which include the step of electroless copper deposition, and this embodiment will be described below. However, it will be apparent that the invention can be used to monitor the plating of other metals on other types of articles.

As known in the art, electroless copper plating is a series of interactive steps involving conditioning, activation, acceleration and, finally, copper deposition. Marginal conditions in any of these steps can result in poor copper coverage, which usually occurs first in the plated-through holes of the printed circuit board.

The present invention allows a determination of which step or combination of steps is responsible for a coverage problem by subjecting a test specimen to the same solutions as the boards. While plating is occurring on the surface of the specimen, light is passed through the specimen and the light transmission is plotted as a function of time. As explained in more detail below, the time it takes to get to a certain level of light transmission can be utilized to determine the ability of the solutions to produce acceptable copper coverage.

Figure 1:
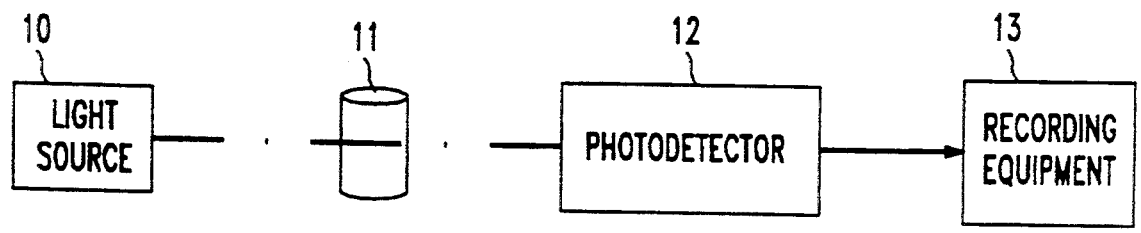
FIG. 1 is a schematic illustration of apparatus which can be utilized to practice an embodiment of the invention.

FIG. 1 illustrates the basic components of the apparatus employed. A monochromatic light source, 10, was used to provide a light beam incident on the test specimen 11. In one example, the light source was a Perkin Elmer Lamda 2 UV-Visible Spectrophotometer with a wavelength of 490 nm which was focused on the specimen by a series of mirrors (not shown). In another example, a 10 watt quartz-tungsten halogen lamp in combination with a 600 nm narrow band filter was employed as the light source, while light was made incident on the specimen by a bundle of optical fibers. In either case, the light transmitted through the specimen, 11, was detected by a photodetector, 12, such as a standard semiconductor photodiode, which convened the light to an electrical signal. The signal was plotted by recording equipment, 13, as a function of time.

In accordance with one embodiment of the invention, copper coverage in the plated-through holes of the board was simulated by using a glass tube as the specimen. In particular, the tube was sequentially filled with conditioner, activator, accelerator and then with the electroless copper plating solution. The light beam was passed through the tube while it was filled with the plating solution. Thus, the walls of the tube became coated with copper and reduced the transmission of light over a period of time. In accordance with an alternative embodiment, the specimen was a piece of the same translucent material as the printed circuit board, which is usually an epoxy glass composition known in the industry as FR-4. The piece was immersed in the various baths and, subsequent to immersion in the plating bath, placed in the apparatus of FIG. 1 while the copper was built up on the surface. Again, light transmission through the specimen decreased over time.

EXAMPLE 1

A transparent glass tube with a 1 cm outer diameter was first filled with a conditioner for a period of 5 minutes. The conditioner was a 5 percent silane-type conditioner which is sold by MacDermid under the designation Conditioner 90. After a deionized water rinse, the tube was then filled with an activator for a period of 5 minutes. The activator was a 0.1-1 percent Pd/Sn activator concentrate which is sold by MacDermid under the designation MACuPrep ™ 95. Following another deionized water rinse, the tube was filled with an accelerator for 3 minutes. The accelerator was an alkylene accelerator which is sold by MacDermid under the designation MACuPrep ™ 97. All solutions were maintained at a constant temperature of approximately 25 degrees C.

Figure 2:
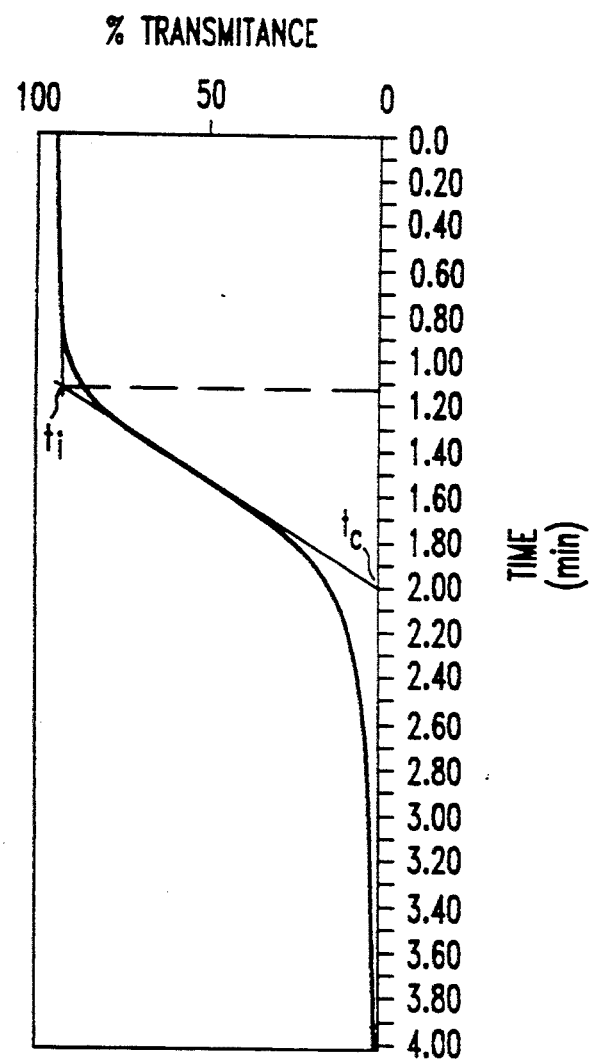
FIG. 2 is a graph of light transmittance as a function of time illustrating a step in accordance with an embodiment of the invention.

After a final deionized water rinse, the tube was placed in a spectrophotometer and filled rapidly with an electroless plating solution. The solution was approximately 3 gm/liter copper, 3-5 gm/liter formaldehyde and 8-10 gm/liter of a hydroxide. Time measurements began as soon as the tube was filled, and a chart recorder generated light transmittance as a function of time graphs such as that shown in FIG. 2. As shown by the graph, light transmittance through the tube initially is relatively constant until time $t_i$, which was approximately 1.12 minutes in this example. At time $t_i$, significant copper nucleation are formed. Subsequent to this time, the copper began to grow laterally, blocking out more and more light, until the deposit covered the entire surface of the tube. At the time, $t_c$, which was approximately 2 minutes in this example, no significant light passed through the tube and the transmittance essentially went to zero. It will be noted that $t_c$ is preferably not the time it takes for the transmittance to go all the way to zero. Rather, it was found that the transmittance curve has an essentially linear portion and that a $t_c$ which is more meaningful in terms of the process parameters is found by extrapolating the linear portion to the zero point on the X (transmittance) axis. Similarly, $t_i$ was determined by the intersection of the portion of the curve exhibiting maximum transmittance with the linear portion of the curve.

Further experiments determined that the catalyst (Pd) concentration, conditioner concentration, and the interaction between conditioner and catalyst had the most effect on $t_i$ and $t_c$.

Either $t_i$ or $t_c$ can be used to determine if a particular combination of solutions will produce adequate coverage. That is, a threshold value of $t_i$ or $t_c$ can be determined experimentally for particular types of plating baths. In this particular example, a threshold value for $t_c$ of 2 minutes was derived. If a $t_c$ is measured above that value, coverage will generally not be adequate, while at $t_c$ below that value indicates a good solution.

Figure 3:
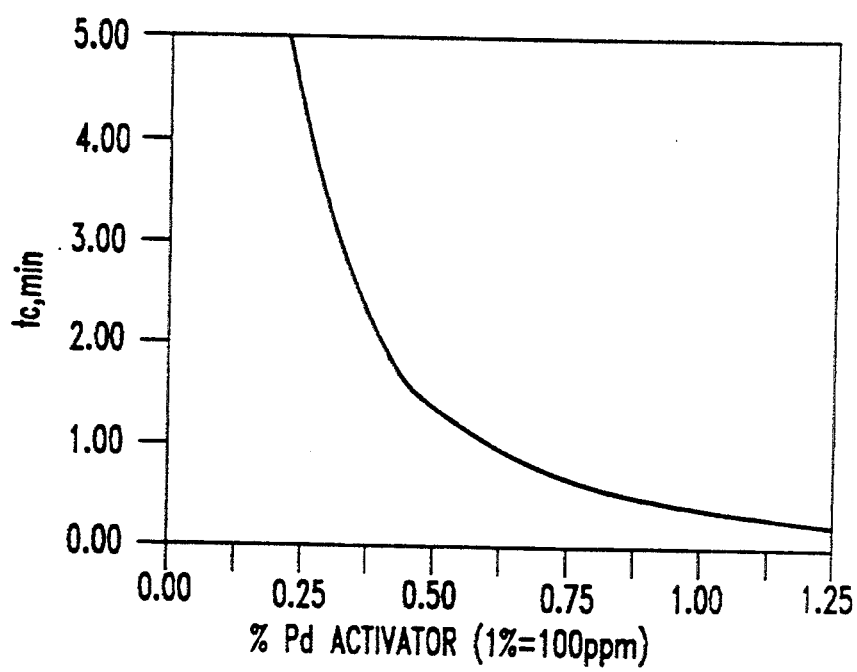
FIG. 3 is a graph of a certain time measurement as a function of concentration in one solution in accordance with the same embodiment.
Figure 4:
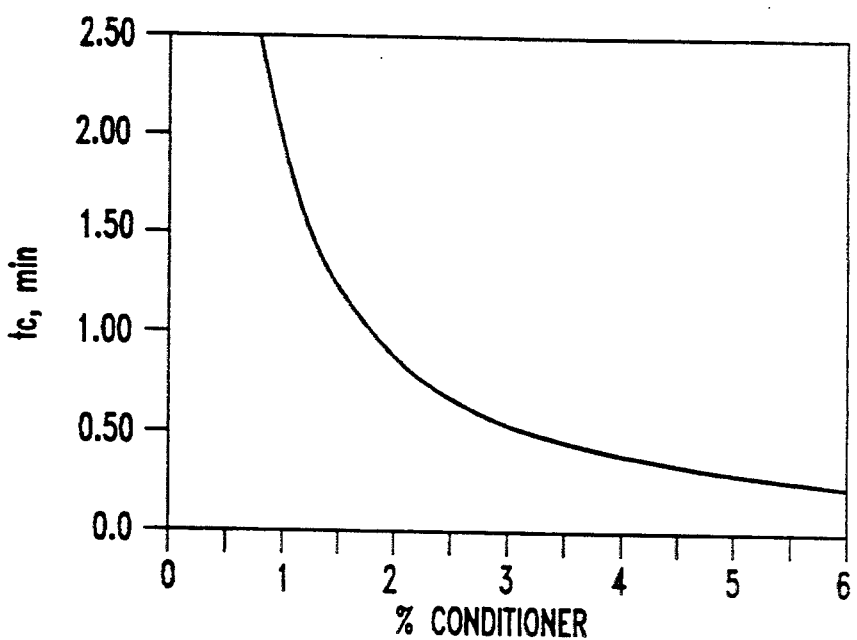
FIG. 4 is a graph of a certain time measurement as a function of concentration in another solution in accordance with the same embodiment.

The appropriate activities of the catalyst (Pd) and conditioner, expressed in terms of concentrations, can be determined by use of the graphs of FIGS. 3 and 4, respectively. ("Activity" in the context of this application means the amount of the material which is actually working in the process.) The graphs show that a measurement of $t_c$ will express the percent of Pd or conditioner which is active in the plating process. Thus, for example, if standard solutions (i.e., laboratory pure) of conditioner and accelerator are used with a factory batch of activator, and $t_c$ is measured as 4.2 minutes, FIG. 3 indicates that relatively only 0.25 percent of the Pd is actually working in the plating process. It is desired in such case to take appropriate actions to increase the relative Pd activity to a level sufficient to achieve at $t_c$ of 2 minutes or less where coverage will be assured. Similarly, when standard solutions of activator and accelerator are used in combination with a factory batch of conditioner, FIG. 4 can be used to determine how much conditioner should be added to get proper coverage.

Thus, according to this method, one can determine if adequate coverage will be obtained in a matter of minutes, whether an initial batch of solutions is being put into the factory or at some point troubles develop and adjustments in concentrations are required.

Example 2

A strip of FR-4 board was first dipped into an activator solution for 5 minutes. The activator comprised approximately 23.5 percent of deionized (DI) water, 70 percent of a mixture including NaCl and HCl which is sold by MacDermid under the designation Metex Predip 9008, 5 percent of concentrated HCl and 1.5 percent of a mixture including palladium and tin which is sold by MacDermid under the designation MAC-10. After rinsing in DI water for 1 minute, the board was dipped in an accelerator solution, which was a 1 normal solution of HCl, for approximately 1 minute. After a further DI rinse, the board was dipped in a standard electroless copper plating solution comprising equal volumes of a first solution consisting essentially of 10 gm/liter $CuSO_4.5H_2O$ and 20 ml/liter formaldehyde (37 percent solution) and a second solution consisting essentially of 40 gm/liter NaOH and 37 gm/liter $Na_2$ EDTA (disodium ethylene diamine tetra acetic acid). The board and plating solution were placed in a spectrophotometer of the type illustrated in FIG. 1 where the light source was a 10 watt quartz-tungsten halogen lamp with a 600 nm narrow band interference filter and the light was delivered to the specimen by a fiber optic bundle.

Figure 5:
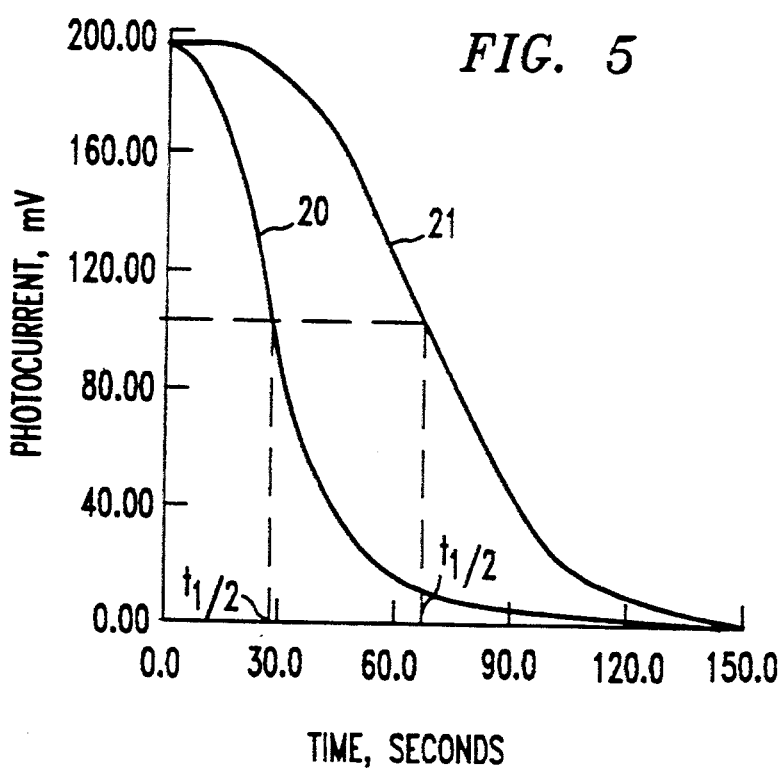
FIG. 5 is a graph of light transmittance as a function of time in accordance with a further embodiment of the invention.

Light transmittance through the specimen was measured by the photodetector (12 of FIG. 1) and a graph foraged by the recording equipment (13). A typical graph is shown in FIG. 5 where transmittance is shown in terms of the photocurrent in millivolts on the Y-axis.

The graph, 20, resulting from the above-described plating is shown compared with a graph, 21, obtained by the same method, but without use of the accelerator solution. It is evident that the difference in catalytic activity with and without the accelerator can be measured by the difference in time for the transmittance to reach a certain level. In this example, the time that it takes for the photo response to decrease to one-half its initial value, $t_{\frac{1}{2}}$, is used as a convenient measurement.

Figure 7:
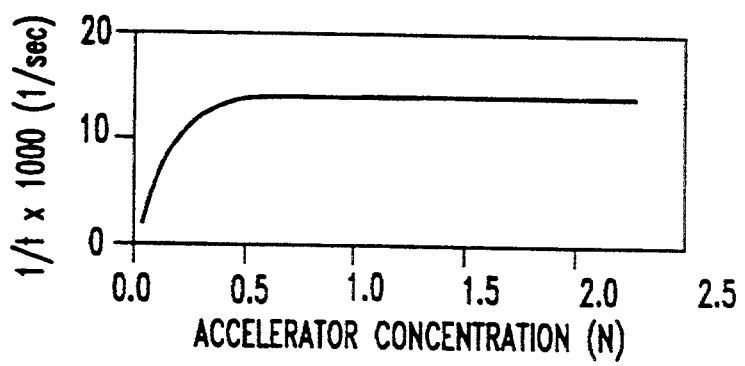
FIG. 7 is a graph of a certain time measurement as a function of concentration in another solution in accordance with the same embodiment.
Figure 6:
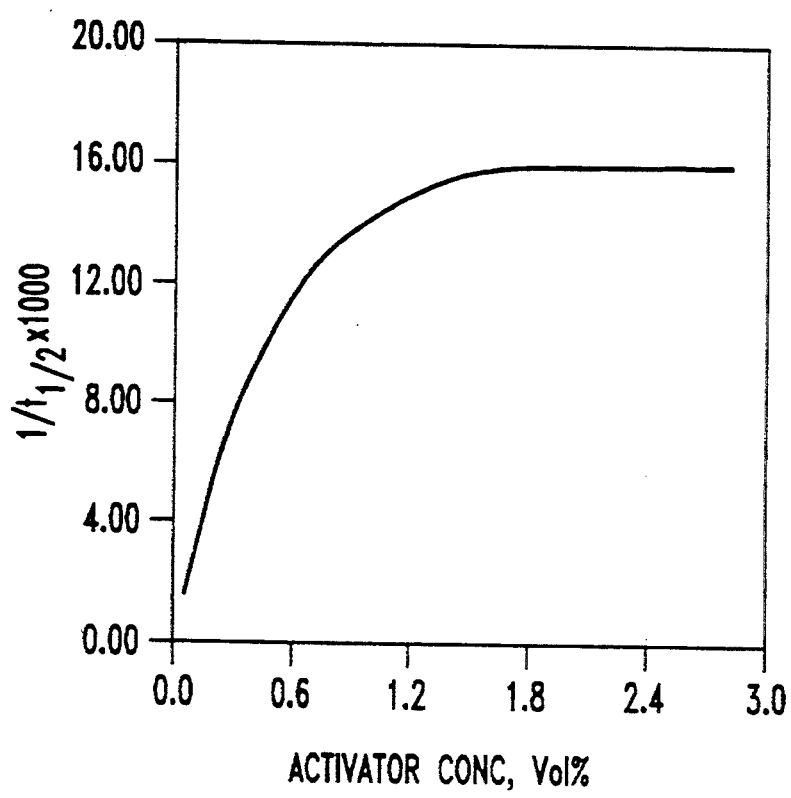
FIG. 6 is a graph of a certain time measurement as a function of concentration in one solution in accordance with the same embodiment.

FIG. 6 illustrates the variation of $t_{\frac{1}{2}}$ as a function of the activator concentration. The Y-axis is shown as the inverse of $t_{\frac{1}{2}}$ to amplify the results. FIG. 7 illustrates the variation of $t_{\frac{1}{2}}$ as a function of the accelerator concentration.

Again, it is demonstrated that a measure of the time light transmittance decreases though the specimen can be used to monitor the various solutions used for plating. In this particular example, a threshold for $t_{\frac{1}{2}}$ can be found for adequate coverage based on experimentation. In this case, a useful threshold would be approximately 1 minute.

Alternatively, the "take time", which is the initial time duration in which there is no change in transmittance, can also be used for the time measurement. Experiments were also performed using indium fin oxide coated quartz substrates in place of FR-4 substrates with similar results.

Although copper plating solutions were used in these examples, the invention should also be applicable to other types of metallic solutions such as gold and nickel.

Various modifications of the invention will become apparent to those skilled in the art. All such variations which basically rely on the teachings through which the invention has advanced the an are properly considered within the scope of the invention.

We claim:

1. A method of monitoring the effectiveness of solutions used in plating articles comprising:

applying the solutions to a specimen which permits light to be transmitted therethrough; and while the specimen is being plated, measuring the level of light transmission therethrough and determining a time in which light transmission decreases to a particular value based on a curve of the decrease in light transmission as a function of time.

2. The method according to claim 1 wherein the said time is compared with a threshold time to indicate if the article will be sufficiently plated by the solutions.

3. The method according to claim 1 wherein the decrease in light transmission as a function of time exhibits an essentially linear portion, and the said time is determined by extrapolating the linear portion to an axis at the point of no light transmission on the curve.

4. The method according to claim 1 wherein the said time is the time when the light transmission through the specimen begins to decrease a significant amount.

5. The method according to claim 1 wherein the said time is the time when light transmission decreases to a particular percentage of its initial value.

6. The method according to claim 5 wherein said time is the time the light transmission decreases to one-half its initial value.

7. The method according to claim 1 wherein the article is a printed circuit board with holes therethrough, and the specimen is a transparent tube which simulates plating in the holes.

8. The method according to claim 1 wherein the article is a printed circuit board, and the specimen is the same material as the printed circuit board.

9. The method according to claim 1 wherein the solutions comprise a conditioner, an activator, an accelerator and an electroless plating solution.

10. The method according to claim 9 wherein the plating solution comprises a metallic plating solution.

11. The method according to claim 10 wherein the plating solution comprises copper.

12. A method of determining the activity of a component in a solution used in a plating process comprising:

applying a plating bath including the component solution to a specimen which permits light to be transmitted therethrough;

while the specimen is being plated, measuring the level of light transmission therethrough and determining a time in which light transmission decreases to a particular value based on a curve of the decrease in light transmission as a function of time; and correlating the said time with the activity of the component.

13. The method according to claim 12 wherein the component is an activator.

14. The method according to claim 12 wherein the component is a conditioner.

* * * * *